(12) United States Patent
Kamibayashi et al.

(10) Patent No.: US 6,270,666 B1
(45) Date of Patent: Aug. 7, 2001

(54) MAGNETIC TREATMENT APPARATUS FOR FLUIDS AND METHOD FOR USING SAME

(75) Inventors: Yoshiji Kamibayashi, Kawagoe; Takeshi Kiuchi, Kodaira; Mitsutoshi Sanefuji, Higashimurayama, all of (JP)

(73) Assignees: Toushin Keisoku Corp., Kawagoe; Nihon Fusso Kogyo Co., Ltd., Kodaira; Tokyo Ohka Kogyo Co., Ltd., Kawasaki, all of (JP)

( * ) Notice: Subject to any disclaimer, the term of this patent is extended or adjusted under 35 U.S.C. 154(b) by 0 days.

(21) Appl. No.: 09/352,204

(22) Filed: Jul. 13, 1999

(30) Foreign Application Priority Data

Jul. 14, 1998 (JP) .................................................. 10-214897
Mar. 3, 1999 (JP) .................................................. 11-056094

(51) Int. Cl.$^7$ ............................... B01D 35/06; C02F 1/48
(52) U.S. Cl. ........................................... 210/222; 210/695
(58) Field of Search ..................................... 210/222, 223, 210/695; 96/1; 209/223.1, 232

(56) References Cited

U.S. PATENT DOCUMENTS 5,074,998  12/1991  De Baat Doelman ................. 210/97
5,227,683  * 7/1993  Clair ..................................... 210/222

* cited by examiner

Primary Examiner—David A. Reifsnyder
(74) Attorney, Agent, or Firm—Jacobson Holman PLLC

(57) ABSTRACT

A magnetic unit 12 having yokes 15 made of magnetic material, with a permanent magnet on one end and a magnet treatment part 14 contacting a conduit 11 through which fluids move on the other end, is utilized for the purpose of treating fluids by exposure to the line of magnetic force. A plurality of the magnetic units 12 are arranged such that the N and S magnetic poles generated at the magnetic treatment parts 14 alternate along the flow path of the fluids.

5 Claims, 3 Drawing Sheets

MAGNETIC TREATMENT APPARATUS FOR FLUIDS AND METHOD FOR USING SAME

FIELD OF THE INVENTION

The present invention relates to an apparatus for the magnetic treatment of fluids through the application of magnetic fields to the fluid flowing through conduits, and the method for using that apparatus.

BACKGROUND OF THE INVENTION

Alkaline-developing photoresists are used for patterning, for example, chemical-milling and the production of printed wiring boards. As foaming during production is detrimental to the production of printed wiring boards, measures have conventionally been taken to suppress foaming through the addition of antifoaming agents. The ingredients of certain antifoaming agents, such as polyoxyalkylene ethers, glycerol monostearate, polyoxyethylene sorbitan monostearate, and coconut alcohol, are themselves contaminants in developers and the products of these printed wiring boards.

On the other hand, some ingredients of photoresists, such as polymers having a structure unit of styrenes, methyl methacrylate, ethyl acrylate, and methacrylic acid, are separated and deposited on the wall of conduits. The deposits are also contaminants in developers and the products. In order to remove the separated materials described above, 3% aqueous hydrochloric-acid solution and commercial cleaning solution; some cleaning solution containing caustic soda, sodium acetate, butyldiglycol, or surfactants; and those including hydrochloric acid or hydroxycarboxylic acid, as have conventionally been used. However, these methods involve the high costs of chemical cleansing and waste treatment, and are may not be sufficiently effective, depending on the photoresist ingredients.

In this technological environment, a magnetic water-treatment apparatus is publicly known. As the apparatus separates the association of clustered water molecules in order to reactivate them, it may also be utilized to perform defoaming in the development step described above if it functions as expected. However, as the fluid to be treated is exposed to magnetic flux generated between a pair of magnets positioned on opposite ends of a flow of water in the case of the water-treatment apparatus described above, the pair of magnets must be positioned so as to face each other. Therefore, a strong magnetic field also exists in regions other than the area under examination, resulting in the problems of a low efficiency in magnetic-field utilization and a significant loss in magnetic force. In addition, utilization of a water-treatment apparatus such as that described above, comprising a uniform magnetic field only, cannot be expected to have a significant effect.

U.S. Pat. No. 5,074,998 is an exemplary invention intended to prevent the deposition of scale inside conduits. The invention has a constitution in which solenoid-type electric coils are positioned alongside and outside or inside the conduit, a magnetic field, generated by charging the electric coils, is applied to the fluid in the conduit. Control of the strength of this magnetic field is also described in the invention. This is done by adjusting the amplifying-signal electric current of the coil to the characteristic frequency of the scale-forming substance. The fluid is exposed to a magnetic field only once while it flows through a conduit utilizing an apparatus of the invention described above.

SUMMARY OF THE INVENTION

The present invention was developed in view of the above-mentioned points, and its object is to enable magnetic-force-based kinetic energy to affect fluids flowing through conduits.

Another object of the present invention is to facilitate the removal of contaminants such as scale-forming substances existing in the fluid, by changing the coarseness (structural coarseness) of the contaminants, and to change the magnetic-force-based kinetic energy acting on the fluid in order to improve the characteristics of the fluid.

Another object of the present invention is to solve the problem of contamination of the developer and the developed products by controlling and removing foams that are detrimental to the development process without using conventional antifoaming agents, and to effectively remove insoluble substances in the development process that could not be removed by conventional methods.

Another object of the present invention is to enable stable product control in chemical milling and the production of printed wiring boards.

Another object of the present invention is to prevent so called scale that is deposited on the wall of conduits, etc. of photoresist developers such as in the development process, making it easier to clean the alkaline developer.

These and other objects have been attained by using magnetic units in which the ends of each of the yokes are arranged alternately at the N and S poles, and the other ends of said yokes being arranged so as to face each other, in order to form magnetic circuits in which magnetic flux can circulate, resulting in the positioning of the magnetic treatment part of fluids between said other ends of said yokes, with a plurality of said magnetic units being arranged such that the directions of magnetic flux generated at said parts for magnetic treatment change along the flow path of said fluids.

Thus, the present invention is characterized by the inverse application of a magnetic field to a fluid. The inverse application of a magnetic field in the present invention means switching the polarity of magnetic fields in certain regions. As a result, for example, the magnetic flux may point downward in a certain region, while it points upward in adjacent regions. Therefore, when a fluid such as developing solution passes through regions with different magnetic-flux directions, as described above, it is affected by changes in kinetic energy due to the 180-degree changes in the magnetic flux resulting from the polarity change in the magnetic fields. A magnetic field with magnetic flux having alternating directions will be referred to as an alternating magnetic field in the present invention. To form the 180 degree changes in the magnetic flux, it is desirable to insert non-magnetic spacer between adjacent magnetic units to generate an alternative magnetic field stably.

Although the present invention is common to the conventional magnet-type water-treatment apparatus, it also utilizes the effect of the changes in kinetic energy accompanying the inversion of magnetic polarity. Thus, according to the present invention, both the changing magnetic energy and kinetic energy may be applied to water molecules and the like in the developing solution.

The magnetic circuit described above contains blocks of magnetic material polarized to the N pole and the S pole on its largest face, and a yoke with its end magnetically attracted to said polarized surface and other parts arranged so as to surround the flow of the developing solution, and this magnetic circuit configured so that the magnetic flux circulates. The strength of the magnetic flux per unit area is maximized by polarizing the N pole and the pole in the largest area of the blocks of strongly magnetized magnetic material (permanent magnet), enabling efficient magnetization of fluids or of other objects such as solvents, solutes, dispersion, etc.

The present invention is also applicable to the removing of scale containing components such as polymeric polymerizing binders, polymerizable substances, and additives deposited on the flow paths and the tank of developing solutions in the developer, wherein it is desirable to use as cleaning liquid aqueous solutions containing one or more than one ingredient of the components polyearboxylic acid, malic acid, EDTA, and saponin, and to remove the insoluble deposits by exposing said aqueous solution to an alternating magnetic field and then flowing it onto the flow paths and into the developing-solution tank.

The scale formed by deposition due to the use of developers mainly contain one or more than one ingredient of the following: polymeric binders, polymerizable substances, and additives. The polymeric binder used is typically an acrylic ester copolymer, styrene-methyl methacrylate copolymer, or ethyl methacrylate-methacrylic acid copolymer. The polymerizable substances used include photo-cross-linking monomers such as ethylene diacrylate, diethyleneglycol diacrylate, trimethylolpropane triacrylate, bismethacrylate of polyethyleneglycol, ethoxylated alcohol, or phenol (such as 2,2'-bis[4-(methacrylxydiethoxy)phenyl] propane), and methylenebismethacrylamide. These substances also contain polymerization initiators as additives. Examples of them are 1-chloroanthraquinone, 2,2'-methylenebis(4-ethyl-6-tert-butylphenol), 4,4'-bis (dimethylamino)benzophenone, and benzotriazole.

Said specific cleaning liquid is used to remove scale containing such ingredients. It is necessary to subject this cleaning liquid to magnetic treatment by exposing it to the alternating magnetic field. Among the ingredients of said cleaning liquid, polycarboxylic acid contains one or more than one ingredient of the following: malic acid, citric acid, glutaric acid, adipic acid, succinic acid, oxalic acid, tartaric acid, phthalic acid, fumaric acid, and malonic acid. In addition to polycarboxylic acids, ethylenediaminetetraacetic acid (2 sodium salt, EDTA) may also be used. These are used as aqueous solutions. Among said acids, an aqueous solution of polycarboxylic acid such as malic acid and EDTA is desirable.

In the case of malic acid and EDTA, for example, the EDTA content is desirably 3–7 wt parts. A cleaning liquid within said range of EDTA content can achieve its purpose through the synergistic effect of the magnetic treatment to be described below. On the other hand, cleaning liquid outside of this range of EDTA content cannot fully achieve its purpose even with magnetic treatment.

When 5–15 wt parts of cations such as silicon, barium, and magnesium are included in the scale, a mixed aqueous solution of one or more than one ingredient from among tetramethylammonium hydroxide, triethanolamine, and monoethanolamine, and either sodium hydroxide or potassium hydroxide, are used as the cleaning liquid. Through the use of this mixed aqueous solution following magnetic treatment, effective cleaning can be performed in a single-liquid process.

The magnetic treatment described above is conducted by exposing the cleaning liquid comprised of said aqueous solution to an alternating magnetic field, or by applying the alternating magnetic field to the cleaning liquid. As described above, the alternating magnetic field contains multiple magnetic fields formed fully across the flow path of fluids such as cleaning liquids, developing solution, and the like, with the direction of the magnetic flux of adjacent magnetic fields being opposite and in alternation. The direction of said magnetic flux will cross the flow of fluids at nearly right angles. Though the alternating magnetic field is applied at the top of the highest stream and any required positions downstream from that point, if the fluid is circulable it may be applied anywhere within the circulation, upstream or downstream.

It is desirable to form magnetic fields that fully cross the flow path of the fluid by using a magnetic treatment apparatus with which yokes are polarized into N and S poles by positioning the ends of the magnetic yokes at the N-pole side and the S-pole side of a magnetic body, and in which the flow path is located between the other ends of the yokes. See FIG. 2. The change in kinetic energy accompanying the inversion of magnetic polarity in such magnetic fields can produce highly active water by disrupting the association of water molecules that may have occurred in the flowing water, as if a vibration had been applied.

According to the present invention, substances that cause foaming are dispersed through the application of an alternating magnetic field to the aqueous solution that flows through a developer, so that scale may be prevented from developing even when the apparatus is not being cleaned. Thus, cleaning efficiency is significantly improved through the application of an alternating magnetic field together with cleaning liquid, while the cleaning process may be significantly simplified through the application of an alternating magnetic field to the developing solution during the developing process, due to the reduction in the amount of scale deposition.

Water can be activated by the magnetic treatment exposing cleaning liquid to an alternating magnetic field. At the same time, nucleophilic/electrophilic and positive/negative bipolar water-soluble substances can be produced within the molecules of the components of the aqueous solution, and insoluble monomers are added to the bipolar water-soluble substances through reactions to turn them into water-soluble scale. The mechanism in the present invention may be best explained in this manner.

DESCRIPTION OF THE INVENTION

Figure 1:
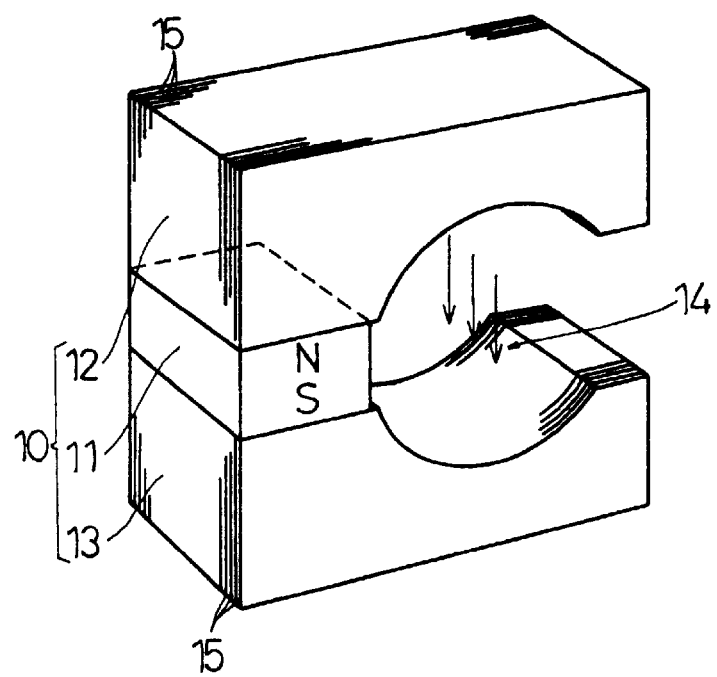
FIG. 1 is a perspective view illustrating an example of an apparatus for magnetic treatment of liquid according to the present invention, and a magnetic circuit unit directly used to implement the method of using same.

As described above, the apparatus for magnetic treatment according to the present invention configured by positioning multiple magnetic circuits along the flow of a fluid so that their polarity is inverted alternatingly, and an example of the magnetic circuit unit 10 is illustrated as the embodiment shown in FIG. 1. The block of strongly magnetized magnetic material (or a permanent magnet) 11 is preferably flat in form, and the N and S poles are polarized on its largest face.

The ends of a pair of yokes 12, 13 are positioned at each polarized face, and the other ends of the yokes 12, 13 are extended so as to surround the flow path of the fluid to form the magnetic-treatment part 14 to which magnetism is to be applied. Yokes 12, 13 may be formed as piled bodies of magnetic-material sheets 15, and the magnetic flux of the magnetic circuit, which roughly forms a C-shape as a whole, points from one end to the other of the yoke within the magnetic-treatment part 14. See the arrows in FIG. 1.

A plurality of the strong magnetic circuit units 10 made from a magnetic material 11 that consisted of permanent magnets polarized at their largest faces and made from yokes 12 and 13 connected respectively to each of said polarized areas in the magnetically attracted state, is arranged along the turning flow of the fluids. An example of the feature is shown in FIG. 2.

Figure 2:
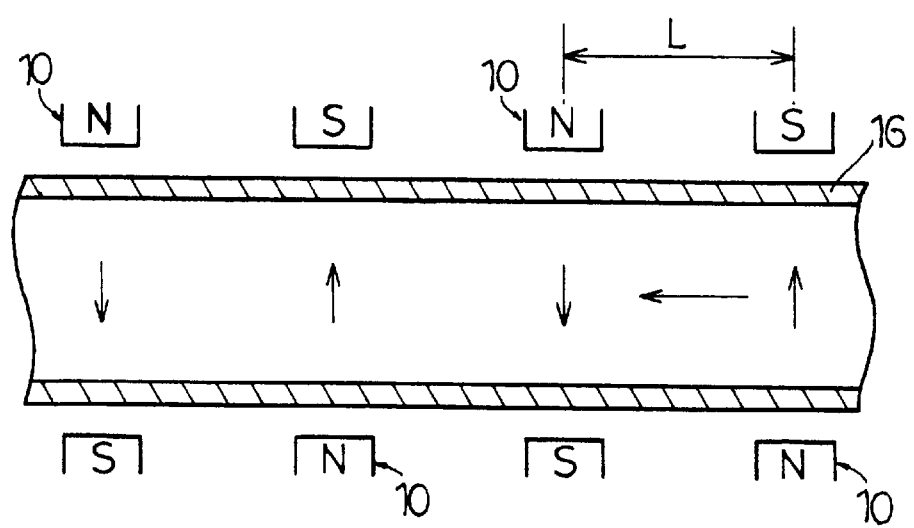
FIG. 2 is a cross-sectional view illustrating the same apparatus for magnetic treatment.

For example, by arranging multiple units so that the flow path 16 of a fluid, such as tubing, can be positioned between a pair of yokes 12, 13 of the magnetic-circuit units 10 at required intervals L, a condition can be created in which the direction of the magnetic flux changes 180 degrees upward and downward, as shown in the example in FIG. 2.

By arranging magnetic-circuit units 10 in this manner, the fluid flowing through a certain point 14 between the yokes receives force in directions 180 degrees different from one unit to another. The change can have various effects, and the frequency in the tube generated by the present invention is shown relative to the flow path of the fluid, the output of the pump contributing to the flow of fluid, and the flow rate in the tube. Table 1 is inserted.

According to Table 1, when the internal diameter of the tube is 50 mm and the flow rate in the tube is 3.0 m/s, an alternating magnetic field with a frequency of 60 Hz is obtained, and when the internal diameter of the tube is 20 mm and the flow rate in the tube is 4.2 m/s, an alternating magnetic field with a frequency of 84 Hz is obtained. As the flow rate can easily be reduced using the flow adjustment valve, and easily increased by increasing the output of the motor, an alternating magnetic field of at least 20 Hz to 200 Hz can easily be obtained. This assumes that the intervals L between magnetic-circuit units 10 are equal, and that the frequency may be further changed by adjusting the intervals L.

The magnetic-circuit units 10 in the present invention have yokes 12, 13 positioned on the parts of permanent magnets on the largest face, and the yokes 12, 13 are arranged along the line of magnetic force so that individual magnetic forces can be most effectively utilized. Blocks of Neodimium (Nd)-based magnetic materials may be used, some of which have a magnetic flux density of as high as 25,000 Gauss and a very high magnetic frequency. Neodimium-iron-boron magnets, which are known to be capable of generating maximum energy, are also effective.

Figure 3:
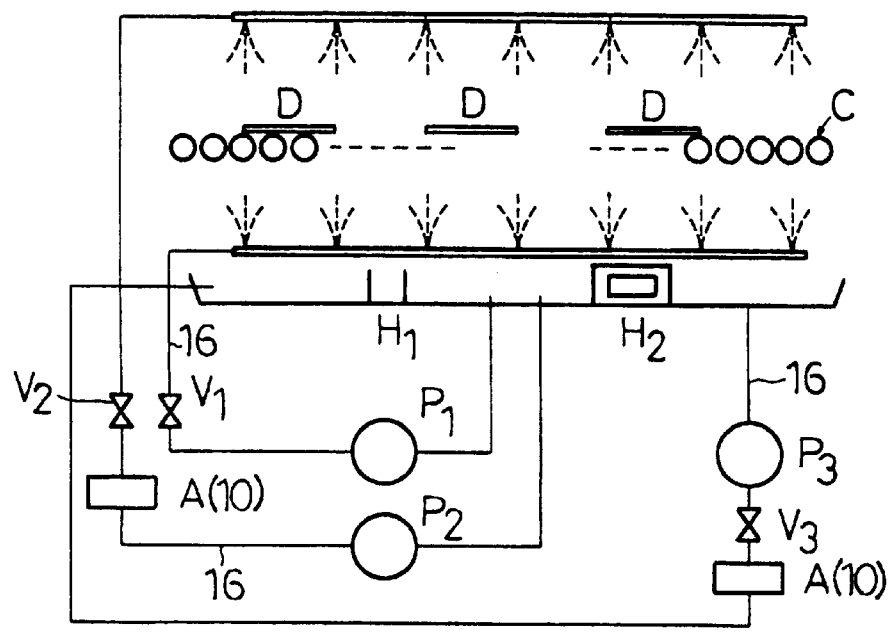
FIG. 3 is a schematic view of the entire developer used in Example 1.

An example of the arrangement of 1,000–5,000-Gauss magnetic-circuit units along the tubing, etc. of a developer for circulating developing solutions, at intervals of 20 mm to 50 mm, for example, in order to adapt the magnetic-treatment apparatus described above for magnetic treatment, will be explained below. FIG. 3 illustrates an application of the present invention to an alkine developer used in the production of printed wiring boards. As previously explained, boards of this type have resist coating containing such chemicals as polymers having a structure unit of styrene-type compounds, methyl methacrylate, ethyl acrylate, methacrylic acid, and the like, which are dissolved during the developing process and are deposited on the wall of conduits.

A dilute aqueous solution of, for example, $Na_2CO_3$, $[N(CH_3)_4]_2CO_3$, $[N(CH_3)_4]_4HCO_3$, NaOH, $(CH_3)_4NOH$, and the like is used as the developing solution. In this case, the developing solution is circulated in the apparatus through tubing using a circulating pump P3, and controlled at a predetermined treatment temperature using a heater H1 and a cooler H2 operated in combination. The flow rate of the developing solution is controlled using a flow-rate control valve V3, and when spray pumps P1, P2 are operated to spray the developing solution against the printed wiring boards D on the conveyer C during the developing process, the internal pressure and flow rate are controlled using flow-rate control valves V1, V2 for those pumps.

Therefore, the magnetic-treatment apparatus A according to the present invention is connected with the tubing on the discharge side of the circulating pump P3 and the spray pump P2. Apparatus A of the present invention forms an alternating magnetic field through the use of at least two pairs of magnetic-circuit units 10. Conditions such as strength, flux density, and frequency, to be applied for a unit amount of the developing solution, can be pre-determined experimentally.

The present invention's performance of the magnetic treatment of developing solution will be demonstrated using examples.

EXAMPLE 1

The developing process was carried out using the developer shown in FIG. 3, on a treated board (336 mm×336 mm×1 mm, laminated on both sides with an alkali development-type dry-film photoresist (AQ4036 40-micron type from Asahi Chemical Industry Co., Ltd.)) D, using a mixed solution of 1 wt % each of $[N(CH_3)_4]_2CO_3$, $[N(CH_3)_4]_4HCO_3$, as the developing solution. As the preparatory works, the developing solution was controlled at the specified temperature using a heater H1 and a cooler H2 operated simultaneously, and circulated using a circulation pump P3, with the flow rate of the circulating pump controlled using a w-rate control valve V3. For the developing process, the developing solution was supplied using spray pumps P1, P2 at a controlled internal pressure.

Conditions

| | |
|---|---|
| Amount of developing solution in the developer | 380 l |
| Flow rate of the spray pump | 350 l/min. |
| Flow rate of the circulation pump | 80 l/min. |
| Internal diameter of the spray-pump tubing | 50 mm |
| Internal diameter of the circulation-pump tubing | 20 mm |

Flow rate in the tubing: Um/s. is calculated using the flow rate of the pump W $cm^3$ and the internal diameter of the tubing d cm by $$U = W/(1/2*d)^2 \pi/60 \ s. \times 1/100.$$

Flow rate inside the spray-pump tubing=2.97 m/s.

Flow rate inside the circulation-pump tubing=4.25 m/s.

Frequency on the spray-pump-tubing side 2.97×1000/50= 59.4 Hz

Frequency on the circulation-pump-tubing side 4.25× 1000/50=85.0 Hz

Magnetic-circuit unit: Four pairs of magnetic-circuit units utilizing Neodimium-based permanent magnets with a magnetic-flux density of 4,000 Gauss were alternatingly arranged so that the N and S poles were inversely positioned at intervals of 25 mm on the discharge-side tubing of the pump P3 at 0.4 m2/l, and during developing on the discharge side of the pump P2 at 0.6 m2/l.

The fluid load and amount of foaming obtained in testing carried out under the conditions described above are shown in Table 2.

Table 2 is inserted.

The fluid-load values were calculated as follows:

$$0.336 \times 0.336 \times 2 \times \text{number of treated boards} \div 380 \text{l} = \text{fluid load}(m^2/l)$$

Figure 4:
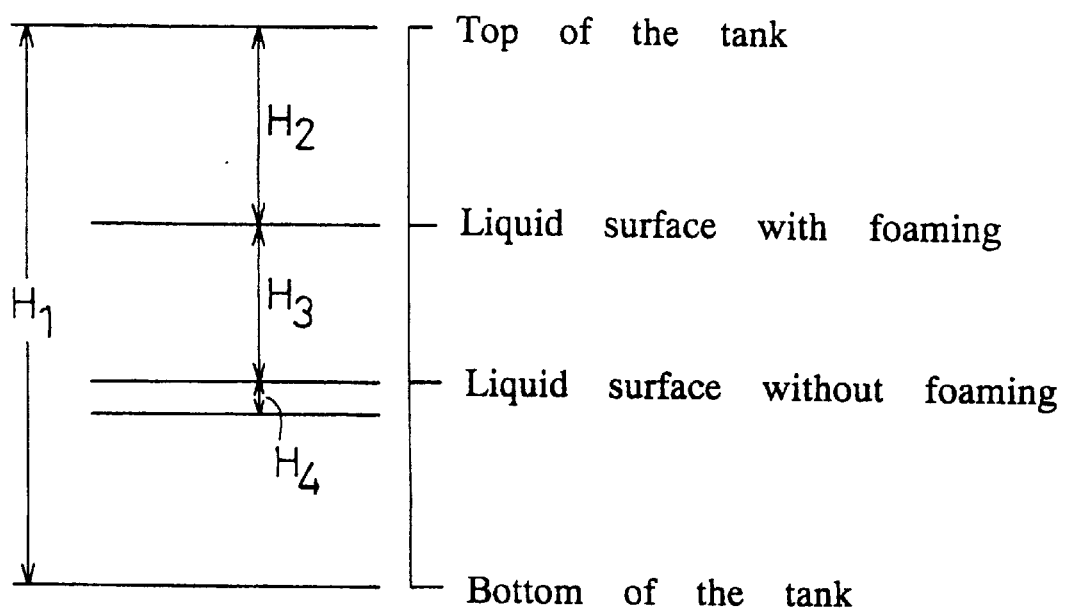
FIG. 4 shows the conditions for determining the amount of foaming.

The amount of foaming was calculated as follows:

Developing solution was held in the reservoir and the amount of foaming was determined based on the measurements shown in FIG. 4.

$H_1$: Height of the liquid surface without foaming in the control operation using water (120 mm)

$H_2$: Height of the liquid surface with foaming in the developing operation (mm)

$H_3 = H_1 - H_2$ (mm)

$H_4$: Liquid-surface lowering due to loss of developing solution entrained by the treated boards (mm)

$H_5$ (Net amount of foaming)=$H_3 + (H_4/\text{number of treated boards at } H_4) \times \text{number of treated boards at the time of measurement}$ (mm)

It was thus determined that the fluid load could be increased to 0.9 $m^2/l$ without the use of antifoaming agents.

COMPARATIVE EXAMPLE 1

This example was conducted under the same conditions as in Example 1 using the developer shown in FIG. 3, except that all the magnetic-circuit units 10 were removed. The results are shown in Table 3.

Table 3 is inserted.

In this case, the developing operation cannot be continued without the addition of antifoaming agents when the fluid load surpasses 0.22 $m^2/l$.

COMPARATIVE EXAMPLE 2

This example was conducted under the same conditions as in Example 1 using the developer shown in FIG. 3, except that a conventional magnetic-treatment unit was connected with the circulation-pump tubing. The results are shown in Table 4.

Table 4 is inserted.

The conventional magnetic-treatment unit was of the type described in BACKGROUND OF THE INVENTION, for which the limit of effect was estimated to be at a fluid load of 0.3 $m^2/l$ when abnormal foaming persisted.

COMPARATIVE EXAMPLE 3/EXAMPLE 2

Development was carried out without a magnetic field as in Comparative Example 1, except that 1 wt % $Na_2CO_3$ aqueous solution was used as the developing solution. As abnormal foaming occurred in this case at a fluid load of 0.3 $m^2/l$, 150 cc of antifoaming agent was added. This example shall be Comparative Example 3. An image-processed microphotograph of the scum in the developing solution sampled at this stage is shown in FIG. 5.

At the end of Comparative Example 3 described above, magnetic-circuit units 10 according to the present invention were arranged at the same positions as in Example 1, and the treatment was carried out for 1 hour. This shall be Example 2. An image-processed microphotograph of the scum in the developing solution sampled at this stage is shown in FIG. 6.

Figure 5:
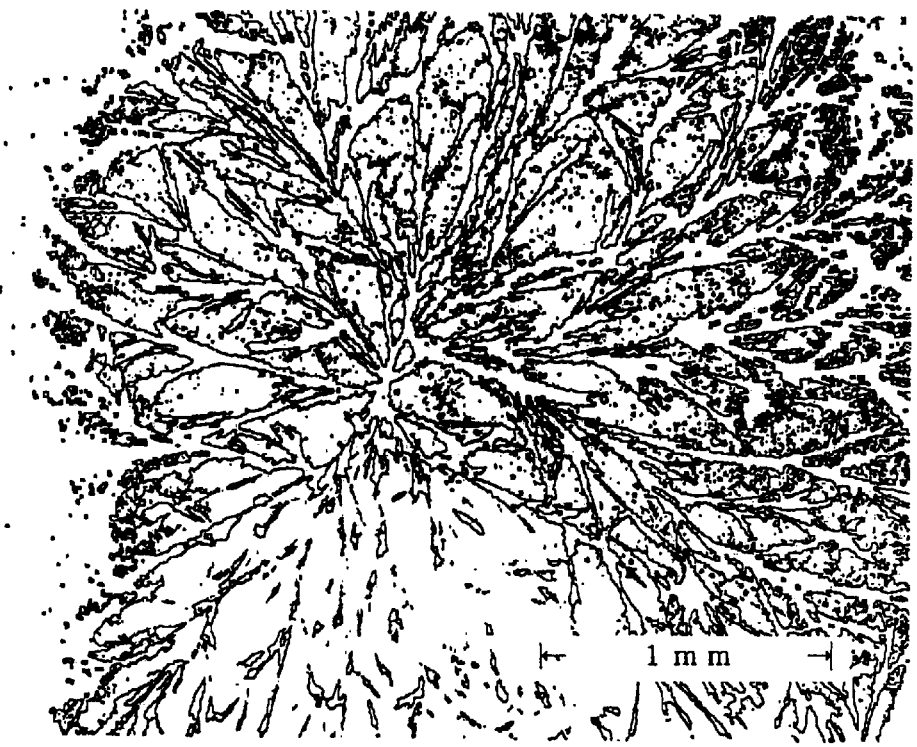
FIG. 5 is an image-processed microphotograph illustrating the scum in Comparative Example 3.
Figure 6:
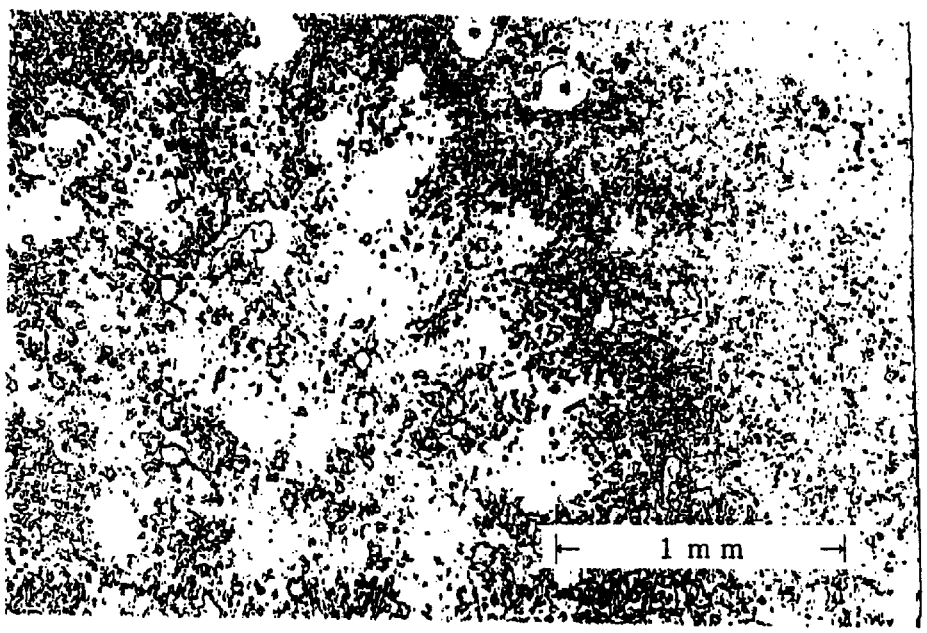
FIG. 6 is an image-processed microphotograph illustrating the scale in Example 2.

While the scum shown in FIG. 5 had grown radially, it can be confirmed that a radial structure as shown in FIG. 5 had not been formed in FIG. 6 from the sample magnetically treated according to the present invention. Such scum having a radial structure has strong bonding force among the molecules forming insoluble materials, and is difficult to remove even when foaming is stopped using antifoaming agents. As the scum magnetically treated according to the present invention does not have a radial structure, even if scale forms it will be relatively easily decomposed, and the influence of contamination on the apparatus and products will be significantly reduced.

A method of cleaning the developer using the magnetic-treatment apparatus will be explained next.

The developers to which the method for cleaning according to the present invention is applied are used in chemical milling and the production of printed boards, and the resist coating of the boards contains ingredients such as polymeric binders, which are gradually dissolved into the circulating developing solution and deposited as insoluble materials on the walls of tubing and tanks. For example, dilute aqueous solutions of $Na_2CO_3$, $[N(CH_3)_4]_2CO_3$, $[N(CH_3)_4]_4HCO_3$, NaOH, $(CH_3)_4NOH$, or dilute aqueous solutions of monoethanolamine or triethanolamine may be used as the developing solution.

EXAMPLE 3

The cleaning effect of the developer shown in FIG. 1 was confirmed, using the developing solution described above. The flow rate of the fluid was as follows:

| | |
|---|---|
| Lower spray pump | 350 1/min. |
| Upper spray pump | 350 1/min. |
| Circulation pump | 200 1/min. |

Scale not containing cationic substances such as silicon that was formed as a result of one month of production, was cleaned using a magnetic-treatment apparatus. Cleaning was carried out for two hours using 600l of a mixed aqueous solution of malic acid (50 g/l) and EDTA2Na (5 g/l) as the cleaning solution, at 35° C. and a spray internal pressure of 1.6 kg/cm². As a result, scale was completely dissolved.

EXAMPLE 4

A magnetic-treatment apparatus was used for one month under the same conditions as in Example 1, except that cationic substances such as silicon were contained in the scale that was cleaned, which formed as a result of use of the developer in production. Cleaning was carried out for two hours using 600l of a mixed aqueous solution of tetramethylammonium hydroxide (30 g/l) and potassium hydroxide (30 g/l), at 35° C. and a spray internal pressure of 1.6 kg/cm². As a result, scale was completely dissolved.

COMPARATIVE EXAMPLE 4

Scale not containing cationic substances such as silicon that was formed as a result of one month of production, was cleaned under the same conditions as in Example 1, except that the magnetic-treatment apparatus was not used. Cleaning was carried out for two hours using 600l of a mixed aqueous solution of malic acid (50 g/l) and EDTA2Na (5 g/l), at 35° C. and a spray internal pressure of 1.6 kg/cm².

A large amount of shrunken, hardened, and solidified scale substance remained in the apparatus.

COMPARATIVE EXAMPLE 5

Scale not containing cationic substances such as silicon that was formed as a result of one month of production, was cleaned under the same conditions as in Example 2, except that the magnetic-treatment apparatus was not used. Cleaning was carried out for two hours using 600 l of a mixed aqueous solution of tetramethylammonium hydroxide (30 g/l) and potassium hydroxide (30 g/l), at 35° C. and a spray internal pressure of 1.8 kg/cm$^2$.

Solidified scale substance remained as deposition in the apparatus.

COMPARATIVE EXAMPLE 6

Scale not containing cationic substance such as silicon that was formed as a result of one month of production using a magnetic-treatment apparatus at 30° C., was cleaned using a conventional detergent.

The first-stage cleaning solution was used to perform cleaning for two hours at a solution temperature of 35° C. and a spray internal pressure of 1.8 kg/cm$^2$. Following cleaning using water, the second-stage cleaning solution was used to perform further cleaning for one hour at a solution temperature of 35° C. and a spray internal pressure of 1.8 kg/cm$^2$.

First-stage cleaning solution:

| | |
|---|---|
| Ethyleneglycolmonomethylether | 15 g/l |
| Polypropyleneglycol monoacetate | 5 g/l |
| Isobutyric acid | 10 g/l |
| Sodium hydroxide | 50 g/l |

Second-stage cleaning solution:

| | |
|---|---|
| Citric acid | 10 g/l |
| Hydrochloric acid | 60 g/l |
| Polyoxyethylenenonylphenylether | 1 g/l |

Cleaning was carried out using 600 l of cleaning solution with the composition described above, but solidified scale substance remained as deposition in the apparatus.

COMPARATIVE EXAMPLE 7

Scale containing cationic substances such as silicon that was formed as a result of one month of production using a magnetic-treatment apparatus at 30° C. was cleaned using a conventional detergent. The ingredients of the first- and second-stage cleaning solutions and their amounts, as well as the other conditions, were the same as in Comparative example 3.

Inadequate results were obtained, with solidified scale substance remaining as deposition in the apparatus even after the cleaning operation.

The present invention is configured and functions as described above, being capable of applying kinetic energy generated by the inversion of the magnetic force applied to fluid flowing through conduits and, when scale-forming substances are contained in a fluid, having the effect of improving the physical properties of the fluid by, for example, easing the removal of the substances by causing a change in their coarseness.

When the present invention is adapted to the magnetic treatment of developing solutions, foaming of the developing solution in the developing operation can be reduced or eliminated, the use of antifoaming agent will become unnecessary, the problem of contamination of the developers themselves and the products will be solved, the quality of the product can be improved, and stable product control can be achieved, particularly in chemical milling and the production of printed wiring boards.

In addition, as the present invention enables the effective removal of scale containing insoluble substances that formed in alkaline developers and could not be removed by conventional cleaning methods, and also enables scale to be prevented from growing even in processes without cleaning, it is possible to greatly ease cleaning of alkaline developers. Documents Describing Chemical Formulas and Related Information

TABLE 1

| Tube | Pump motor | Flow rate in the tube | Frequency inside the tubing |
|---|---|---|---|
| 20 mm | 0.4 Kw | 4.2 m/s | 84 Hz |
| 25 mm | 0.4 Kw | 4.1 m/s | 82 Hz |
| 40 mm | 0.75 Kw | 3.3 m/s | 66 Hz |
| | 1.50 Kw | 3.6 m/s | 72 Hz |
| | 2.20 Kw | 3.3 m/s | 66 Hz |
| 50 mm | 2.20 Kw | 2.4 m/s | 48 Hz |
| | 3.70 Kw | 3.0 m/s | 60 Hz |
| | 5.50 Kw | 3.0 m/s | 60 Hz |

TABLE 2

| Number of treated boards D | Liquid load (m$^2$/l) | Apparent amount of foaming $L_3$ (mm) | Net amount of foaming $L_5$ (mm) | Notes |
|---|---|---|---|---|
| 673 | 0.40 | 30 | 30.0 | MTA was connected to the circulation-pump tubing. |
| 745 | 0.44 | 30 | 35.0 | Liquid surface lowered by 15 mm → 16 l of water added $L_5 = L_3 + 15/222 \times D$ |
| 845 | 0.50 | 60 | 71.6 | |
| 895 | 0.53 | 55 | 70.0 | |
| 895 | 0.53 | 95 | 95 | A was connected to the spray-pump tubing. |
| 1010 | 0.60 | 25 | 28 | |
| 1172 | 0.70 | 55 | 62 | Liquid surface lowered by 11.5 mm → 13 l of water added $L_5 = L_3 + 11.5/435 \times D$ |
| 1265 | 0.75 | 75 | 85 | |
| 1330 | 0.79 | 75 | 87 | |
| 1390 | 0.83 | 20 | 21.7 | Mixed for one hour using pump |
| 1430 | 0.85 | 20 | 22.8 | |
| 1470 | 0.88 | 30 | 33.9 | Liquid surface lowered by 5 mm → 5 l of water added $L_5 = L_3 + 5/180 \times D$ |
| 1510 | 0.90 | 40 | 45.0 | |

MTA: Magnetic Treatment Apparatus of this Invention.

TABLE 3

| Number of treated boards D | Liquid load (m$^2$/l) | Apparent amount of foaming $L_3$ (mm) | Net amount of foaming $L_5$ (mm) | Notes |
|---|---|---|---|---|
| 0 | 0 | 20 | 20.0 | Liquid surface lowered |
| 100 | 0.06 | 20 | 28.0 | by 15 mm → 15 l of |

TABLE 3-continued

| Number of treated boards D | Liquid load (m²/l) | Apparent amount of foaming $L_3$ (mm) | Net amount of foaming $L_5$ (mm) | Notes |
|---|---|---|---|---|
| 150 | 0.09 | 25 | 32.0 | water added, 5 l of |
| 200 | 0.12 | 25 | 41.0 | TMAH added |
| 250 | 0.15 | 30 | 50.0 | |
| | | | | $L_5 = L_3 + 20/250 \times D$ |
| 300 | 0.18 | 77 | 81.1 | Abnormal foaming/50 cc |
| 365 | 0.22 | 100 | 109.4 | of antifoaming agent* added |
| 433 | 0.26 | 50 | 65.0 | |
| 463 | 0.28 | 115 | 132.4 | Abnormal foaming/50 cc of antifoaming agent added |
| 483 | 0.29 | 120 | 139.0 | Abnormal foaming/50 cc of antifoaming agent added |
| 523 | 0.31 | 145 | 167.3 | Abnormal foaming/50 cc of antifoaming agent added |
| 556 | 0.33 | 120 | 145.0 | Abnormal foaming/50 cc of antifoaming agent added Liquid surface lowered by 25 mm → 24 l of water added, 4 l of TMAH added $L_5 = L_3 + 25/306 \times D$ |
| The experiment was discontinued, as abnormal foaming continued. | | | | |

Antifoaming agent ANTIX #100 (Rinkai Chemical Co.) was used.
TMAH: Tetramethyl ammonium hydroxide.

TABLE 4

| Number of treated boards D | Liquid load (m²/l) | Apparent amount of foaming $L_3$ (mm) | Net amount of foaming $L_5$ (mm) | Notes |
|---|---|---|---|---|
| 0 | 0 | 20 | 20.0 | A was connected to the spray-pump tubing. |
| 100 | 0.06 | 5 | 12.2 | Liquid surface lowered |
| 150 | 0.09 | 10 | 20.8 | by 18 mm → 15 l of |
| 200 | 0.12 | 5 | 19.4 | water added, 4.4 l of |
| 250 | 0.15 | 3 | 21.0 | TMAH added |
| | | | | $L_5 = L_3 + 18/250 \times D$ |
| 290 | 0.18 | 47 | 49.0 | Abnormal foaming/50 cc |
| 422 | 0.25 | 80 | 88.1 | of antifoaming agent* |
| 473 | 0.30 | 100 | 111.2 | added |
| 472 | 0.30 | 120 | 133.7 | |
| 624 | 0.37 | 145 | 167.9 | Abnormal foaming/50 cc of antifoaming agent added |
| 673 | 0.40 | 105 | 131.0 | Liquid surface lowered by 26 mm → 23 l of water added, 4 l of TMAH added $L_5 = L_3 + 26/432 \times D$ |

*Antifoaming agent ANTIX #100 (Rinkai Chemical Co.) was used.
TMAH: Tetramethyl ammonium hydroxide.

What is claimed is:

1. A magnetic-treatment apparatus for magnetically treating a fluid moving through a conduit in a flow path at a flow rate, said apparatus comprising:

a plurality of magnetic units;

each of said magnetic units including one magnet having a surface with one polarity and a surface with an opposite polarity, and two yokes;

one of said yokes having a surface which opposes a surface of the other said yoke, a portion of said yoke surface being coupled to said magnet surface with one polarity, and a portion of said other yoke surface being coupled to said magnetic surface with said opposite polarity, said one yoke has said one polarity and said other yoke has said other polarity, with a gap formed between a remaining portion of said opposing yoke surfaces for positioning said conduit;

said plurality of magnetic units being arranged along said conduit such that the polarity of the yokes of adjacent magnetic units are different, and wherein a direction of a magnetic flux along the flow path of said fluid changes.

2. The magnetic-treatment apparatus according to claim 1, wherein said plurality of magnetic units form an alternating magnetic field, and said direction of the magnetic flux circulating along the flow path of said fluid changes by 180 degrees between the adjacent magnetic units.

3. The magnetic-treatment apparatus according to claim 1, wherein said plurality of magnetic units contain spaces between the adjacent magnetic units.

4. The magnetic-treatment apparatus according to claim 1, wherein said conduit us equipped with a flow rate control means for changing the flow rate of the fluid moving through said conduit.

5. The magnetic-treatment apparatus according to claim 2, wherein said plurality of magnetic units being arranged to surround said conduit.

* * * * *